United States Patent
Poustie et al.

[11] Patent Number: 6,035,081
[45] Date of Patent: Mar. 7, 2000

[54] OPTICAL MEMORY

[75] Inventors: Alistair James Poustie, Ipswich; Keith James Blow, Woodbridge; Robert John Manning, Ipswich, all of United Kingdom

[73] Assignee: British Telecommunications public limited company, London, United Kingdom

[21] Appl. No.: 08/904,836

[22] Filed: Aug. 1, 1997

[30] Foreign Application Priority Data

Mar. 27, 1997 [GB] United Kingdom ............. 9706370

[51] Int. Cl.$^7$ ................................................ G02B 6/28
[52] U.S. Cl. ...................................... 385/27; 385/24
[58] Field of Search .......................... 385/27, 24, 31, 385/32, 122

[56] References Cited

U.S. PATENT DOCUMENTS

| | | | |
|---|---|---|---|
| 5,311,347 | 5/1994 | Kubo et al. | 359/176 |
| 5,533,154 | 7/1996 | Smith | 385/27 |
| 5,566,261 | 10/1996 | Hall et al. | 385/27 |

FOREIGN PATENT DOCUMENTS

| | | |
|---|---|---|
| 0 237 184 A1 | 2/1987 | European Pat. Off. |
| 0320305 A1 | 6/1989 | European Pat. Off. |
| 0375346 A1 | 6/1990 | European Pat. Off. |
| 0 543 314 A2 | 11/1992 | European Pat. Off. |
| 0 762 677 | 3/1997 | European Pat. Off. |
| WO 92/09916 | 6/1992 | WIPO |
| WO 93/08574 | 4/1993 | WIPO |

OTHER PUBLICATIONS

Manning et al, "All Optical Clock Division Using a Semiconductor Optical Amplifier Loop Mirror with Feedback", Electronics Letters, vol. 32, No. 6, Aug. 1996, Stevenage, GB, pp. 1504–1505.

*Primary Examiner*—Hung N. Ngo
*Attorney, Agent, or Firm*—Nixon & Vanderhye P.C.

[57] ABSTRACT

A regenerative optical memory comprising a number of concatenated non-linear switching elements coupled by an optical storage element has a transfer function arranged so that only optical data having a pulse amplitude above a predetermined threshold is stored and the amplitude of optical data stored is substantially equalised to at least one predetermined level after a number of circulations within the optical memory. In a preferred embodiment, the optical memory is provided with an optical switching element within the optical loop for selectively switching at least a portion of the data pattern out of the optical loop in response to the application of an optical signal to an input of the optical switching element to alter the contents of the memory.

28 Claims, 13 Drawing Sheets

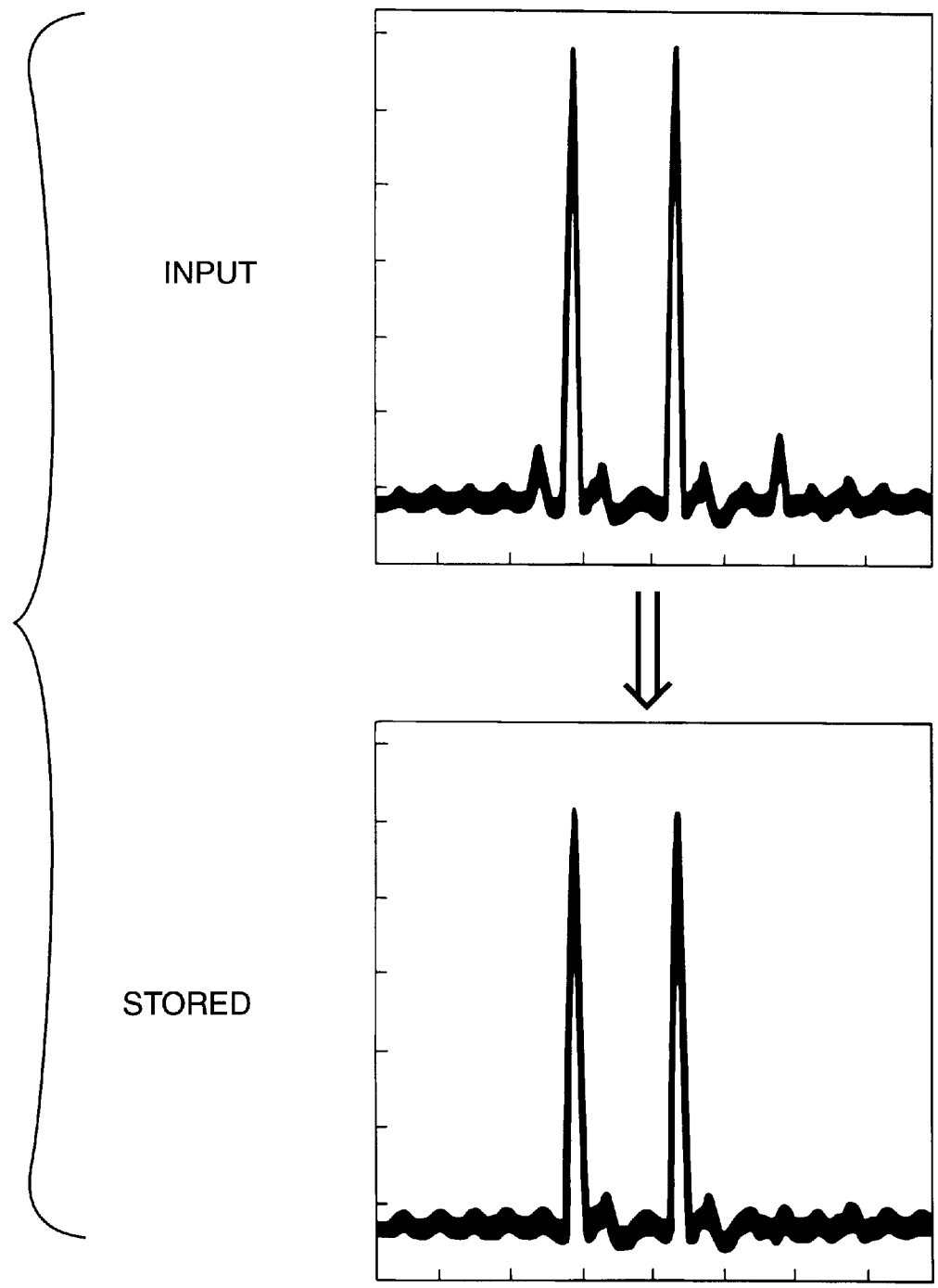

INPUT

STORED

OPTICAL MEMORY

BACKGROUND OF THE INVENTION

1. Field of the Invention

The invention relates to an optical memory.

2. Related Art

The function of "memory" is one of the key building blocks to implement advanced information processing in future ultrahigh-speed photonic networks. For example, memory allows 100 Gbit/s optical packets to be buffered and queued for subsequent processing of the data. Memory is also an intrinsic function for serial optical computing systems. Several types of serial optical memory have been demonstrated previously using recirculating optical fibre loops. These memory designs are either pulse-preserving, where the same optical pulses propagate on each circulation of the storage loop, or regenerative where the pulses are replaced after some number of memory circulations. For pulse preservation memories, the long term stability of the data pattern depends on being able to retime and reshape the optical pulses within the memory loop, since it acts like a long transmission line and the pulses are degraded by propagation effects. These effects are reduced by regenerative architectures which therefore offer superior stability. An all-optical regenerative memory is described in a paper entitled "All-optical regenerative memory", A. J. Poustie, K. J. Blow and R. J. Manning, Nonlinear Guided Waves and their Applications, Vol. 15, 1996 OSA Technical Digest Series, which has now been developed so that an optical pulse binary data pattern can be stored for several hours. This highly stable operation is achieved by full all-optical regeneration of the data pattern after each circulation of an optical fibre delay line. This all-optical memory design, shown in FIG. 1, is a combination of two nonlinear optical switching elements and an optical fibre storage loop.

SUMMARY OF THE INVENTION

According to a first aspect of the present invention, there is provided a regenerative optical memory having a transfer function arranged so that only optical data having a pulse amplitude above a predetermined threshold is stored and the amplitude of optical data stored is substantially equalised to at least one predetermined level after a number of circulations within the optical memory.

In the present invention, a regenerative optical memory is arranged to provide a transfer function which achieves amplitude equalisation for optical data stored by the memory. This has the effect of removing noise. Furthermore, any pulse amplitude modulation in the original input data is also removed. Equalisation may be to a number of predetermined levels determined by the transfer function of the memory. Only data which has a pulse amplitude above a storage threshold level determined by the transfer function of the memory is stored. Preferably, the regenerative memory includes means to vary the storage threshold level.

Preferably, the regenerative memory comprises means for changing the energy of optical data pulses. More preferably, the regenerative memory comprises an optical amplifier, the gain of which is selected for stable storage of data. If the amplifier gain is too low then data rapidly decays as it recirculates the memory. If the amplifier gain is too high then random data may be created in the memory by the amplification of signals having a finite energy. Suitable optical amplifiers include semiconductor optical amplifiers and erbium doped optical amplifiers.

Preferably, the regenerative memory comprises a non-linear switching element. More preferably, the regenerative memory comprises two concatenated non-linear switching elements coupled together by an optical storage element. Preferably, the optical storage element is a length of optical fibre. Alternatively, the optical storage element may be an optical waveguide, suitable examples of which include planar silica waveguides and semiconductor waveguides. Suitable non-linear optical switching elements are semiconductor laser amplifiers in a loop mirror (SLALOMs). These are interferometric non-linear switches with an optical amplifier as the non-linear element. Most preferably, the non-linear switching elements are terahertz optical asymmetric demultiplexers (TOADs), each of which is driven by an optical source. Suitable optical sources are distributed feedback semiconductor lasers.

According to a second aspect of the present invention, a regenerative optical memory in which a data pattern circulates within an optical loop, comprises an optical switching element within the optical loop for selectively switching at least a portion of the data pattern out of the optical loop in response to the application of an optical signal to an input of the optical switching element to alter the contents of the memory.

According to a third aspect of the present invention, a method of operating an optical memory in which a data pattern circulates within an optical loop of the optical memory, comprises the step of switching at least a portion of the data pattern out of the optical loop using a predetermined optical signal applied to an optical switching element positioned within the optical loop.

In this aspect of the present invention, an optical switching element is provided in an optical memory to allow a data pattern circulating within the memory to be selectively switched, thereby altering the contents of the optical memory.

Preferably, the optical memory comprises an optical source for supplying switching pulses to an input of the optical switching element.

Preferably, the optical switching element is an interferometric non-linear switch with an optical amplifier as the non-linear element. More preferably, the optical switching element is a terahertz optical asymmetric demultiplexer (TOAD), which is responsive to switching pulses from the optical source to allow data to be switched out of the optical loop.

Preferably, the optical switching element includes an output for reading out data switched out of the optical loop.

Preferably, the optical memory is a regenerative memory. As such, the regenerative memory may be combined with the memory of any of the first to fourth aspects of the present invention.

There are several applications for optical memories according to the invention. Such a memory may be included in, for example, a computer, an optical repeater, or a communication network.

BRIEF DESCRIPTION OF THE DRAWINGS

Examples of the present invention will now be described and contrasted with a known memory with reference to the accompanying drawings, in which:

FIGS. 5(a) to 5(e) shows oscilloscope traces for a number of data patterns;

DETAILED DESCRIPTION OF THE EXEMPLARY EMBODIMENTS

Figure 1:
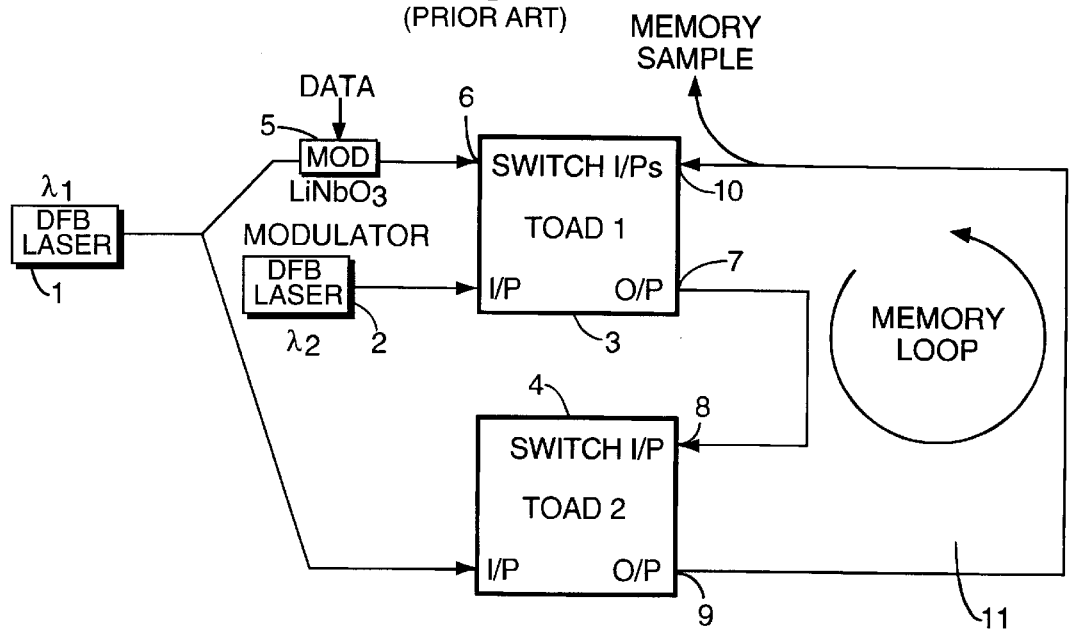
FIG. 1 shows an existing all-optical regenerative memory.

For the purpose of describing the present invention a known all-optical regenerative memory is shown in FIG. 1. Two jitter-suppressed gain-switched distributed feedback (DFB) semiconductor lasers 1 and 2 at wavelengths 1.55 $\mu$m ($\lambda_1$) and 1.533 $\mu$m ($\lambda_2$), respectively, are provided as the optical pulse sources. The pulse repetition rate is $\approx$1 GHz and each source gives $\approx$10 ps pulses after linear chirp compensation in a length of normally dispersive optical fibre. Two nonlinear optical switching elements 3 and 4 are provided each comprising a 50:50 fused fibre coupler, two wavelength division multiplexed (WDM) couplers to introduce and reject the switching pulses, a fibre polarisation controller to bias the loop mirror and a semiconductor optical amplifier offset from the loop centre to give a switching window of $\approx$80 ps. Optical switching elements of this type, known as terahertz optical asymmetric demultiplexers (TOADS), are described in a paper entitled "Asymmetric optical loop mirror: analysis of an all-optical switch", Applied Optics, vol. 33, No. 29, 1994. The pulse train at $\lambda_2$ is used as the input to the optical switching element 3 which is biased to total reflection in the absence of the switching pulses. The pulse train at $\lambda_1$ is split in two; one half is used as the input to the optical switching element 4 which is also biased to total reflection, the other half is modulated with a LiNbO$_3$ amplitude modulator 5 to generate the data pattern to be stored and is fed, only once, into a switching port 6 of the optical switching element 3. To complete the memory circuit, the transmitted output 7 of the optical switching element 3 is connected to the switching input 8 for the optical switching element 4 and the transmitted output 9 of the optical switching element 4 is connected to a second switching port 10 in the optical switching element 3 by an optical fibre storage loop 11. Thus, the optical switching element 3 switches the data pattern from $\lambda_1$ to $\lambda_2$ and the copied data is fed into the memory loop 11. The optical switching element 4 only wavelength converts the data back to $\lambda_1$ so that it can subsequently switch the optical switching element 3 again. The contents of the memory can be monitored by a 10% tap (not shown) within the fibre loop 11. Both short (pattern length $<<\tau$) and long (pattern length$\approx\tau$) data sequences can successfully be stored for several hours with this arrangement. This corresponds to greater than 10 billion circulations around the memory circuit and an effective bit error rate ratio of $<10^{-13}$.

Figure 2:
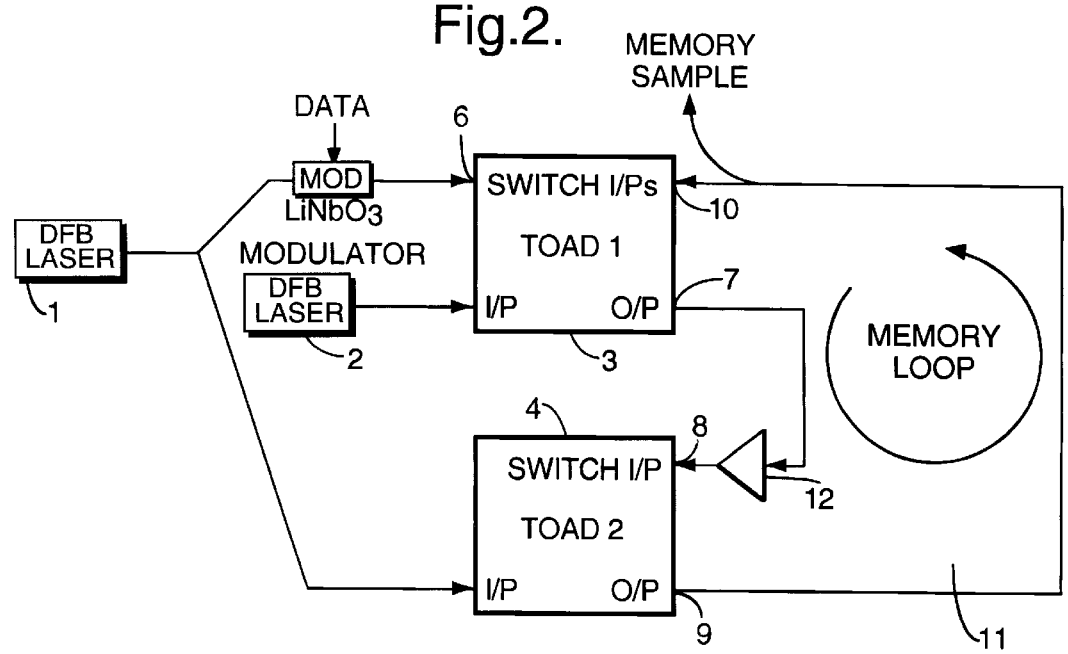
FIG. 2 shows a first example of an all-optical regenerative memory in accordance with the present invention.

FIG. 2 shows an example of an all-optical regenerative memory of the present invention which provides amplitude equalisation such that any pulse amplitude modulation in the original input data is removed. The architecture can discriminate between input pulses of differing amplitudes and so self select which pulses to store. As with the architecture in FIG. 1, the memory architecture in FIG. 2 is a combination of two concatenated nonlinear optical switching elements 3 and 4. Stable storage for several hours is obtained by full all-optical regeneration of the optical pulse data pattern after each circulation of an optical fibre storage loop 11. These semiconductor optical amplifier based nonlinear optical switches have some advantages over all-fibre switching devices in that they require a very low switching energy (typically$\approx$1 pJ per pulse) and can be relatively compact to reduce latency in the optical processing system. In addition to FIG. 1, however, an erbium amplifier 12 is inserted in the loop connecting the output 7 of the switching element 3 to the switching input 8 of the switching element 4.

Figure 3:
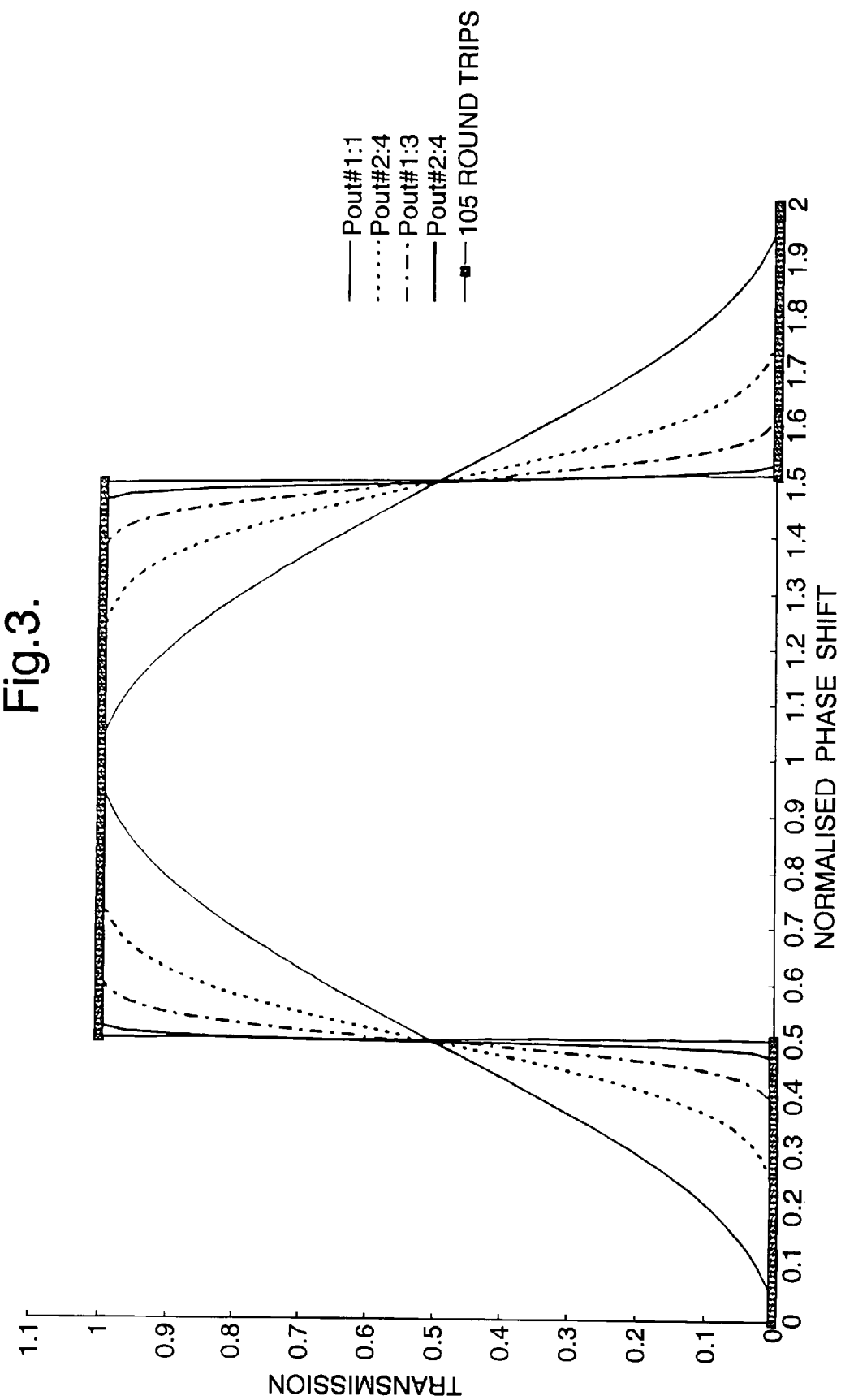
FIG. 3 shows the evolvement of a non-linear switching characteristic from a cosine squared response to a square window.
Figure 4:
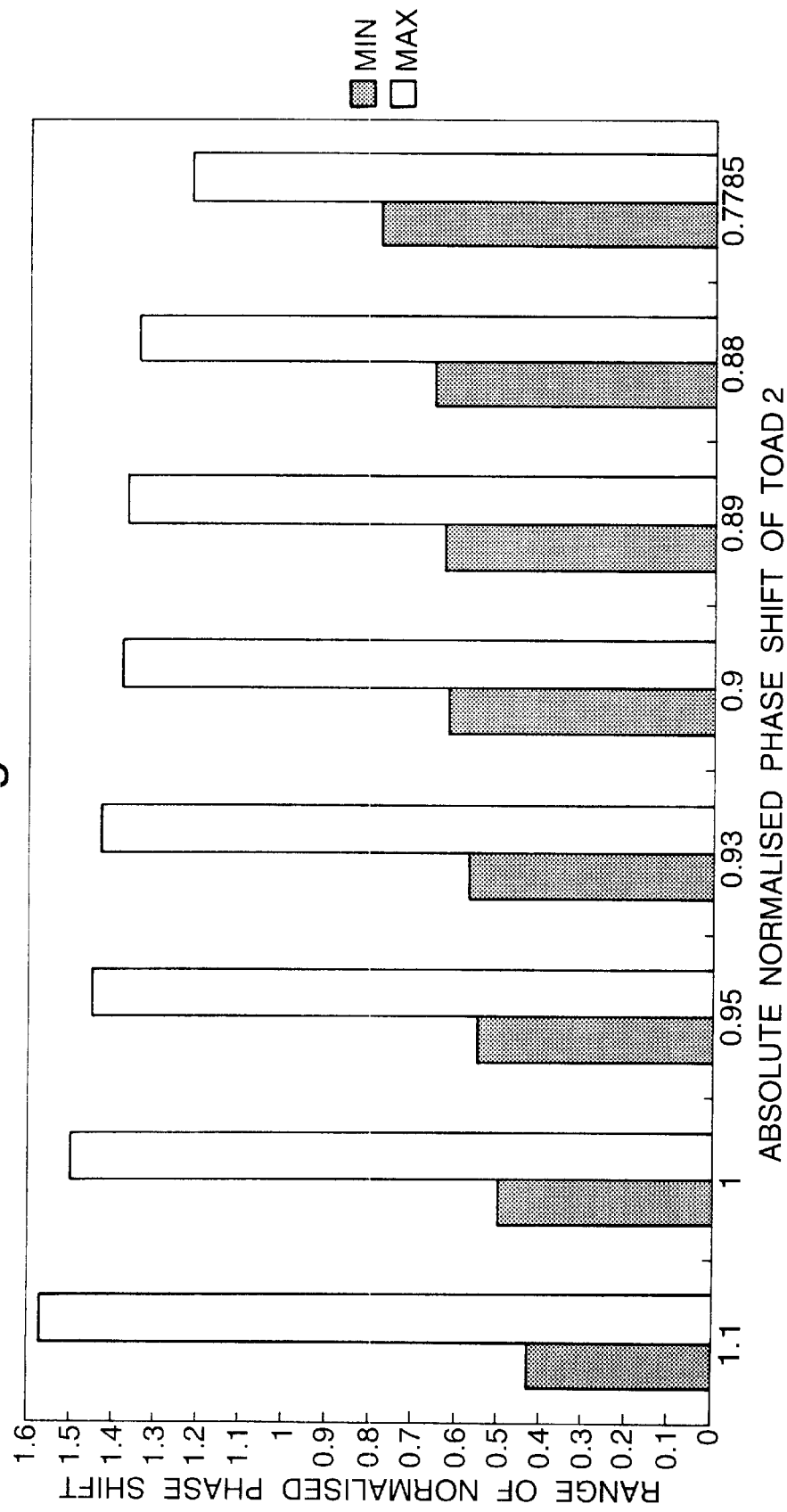
FIG. 4 shows how the square window response shown in FIG. 3 varies as a transfer function of a non-linear optical switching element within the memory is varied.
Figure 5B:
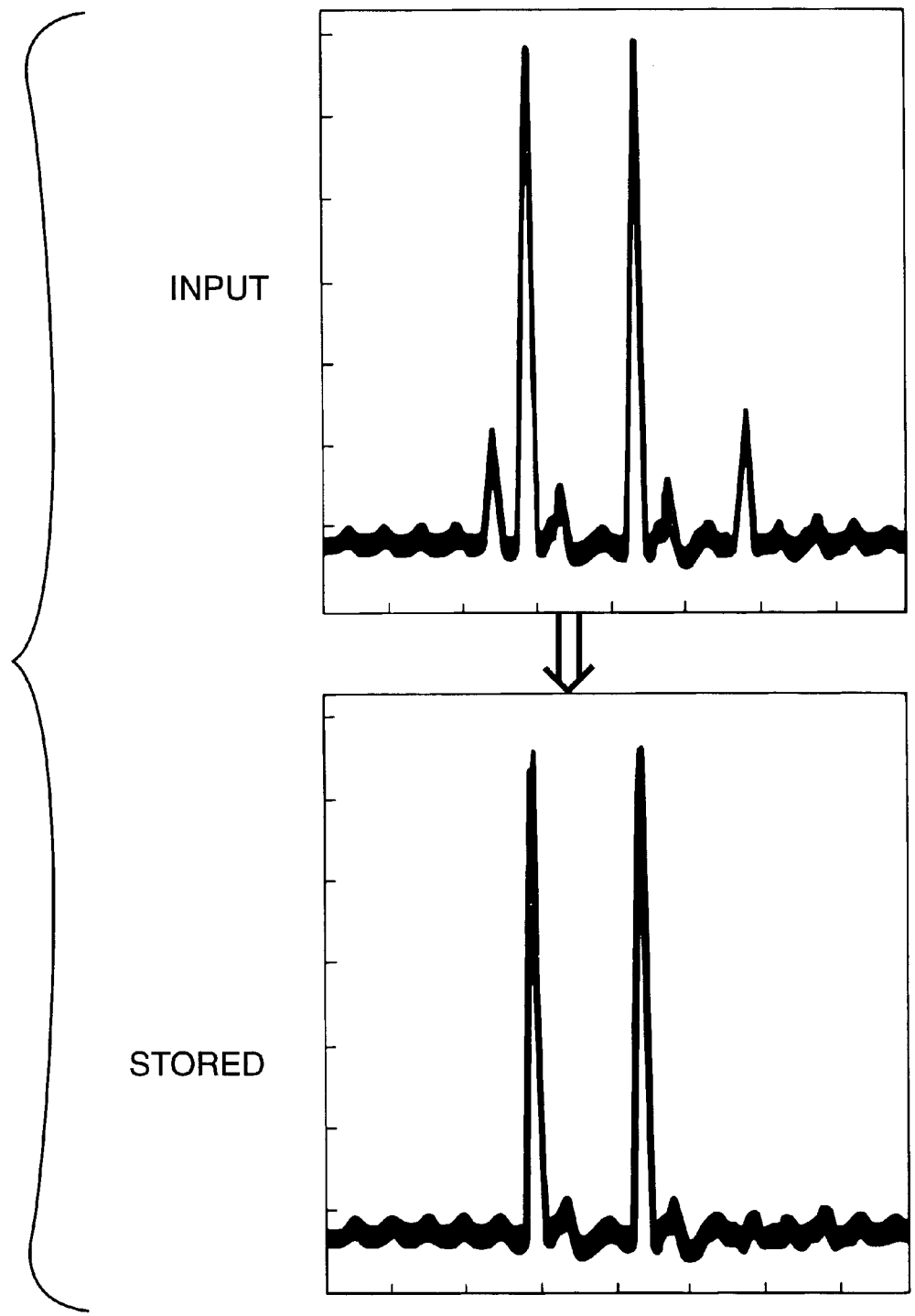
Figure 5C:
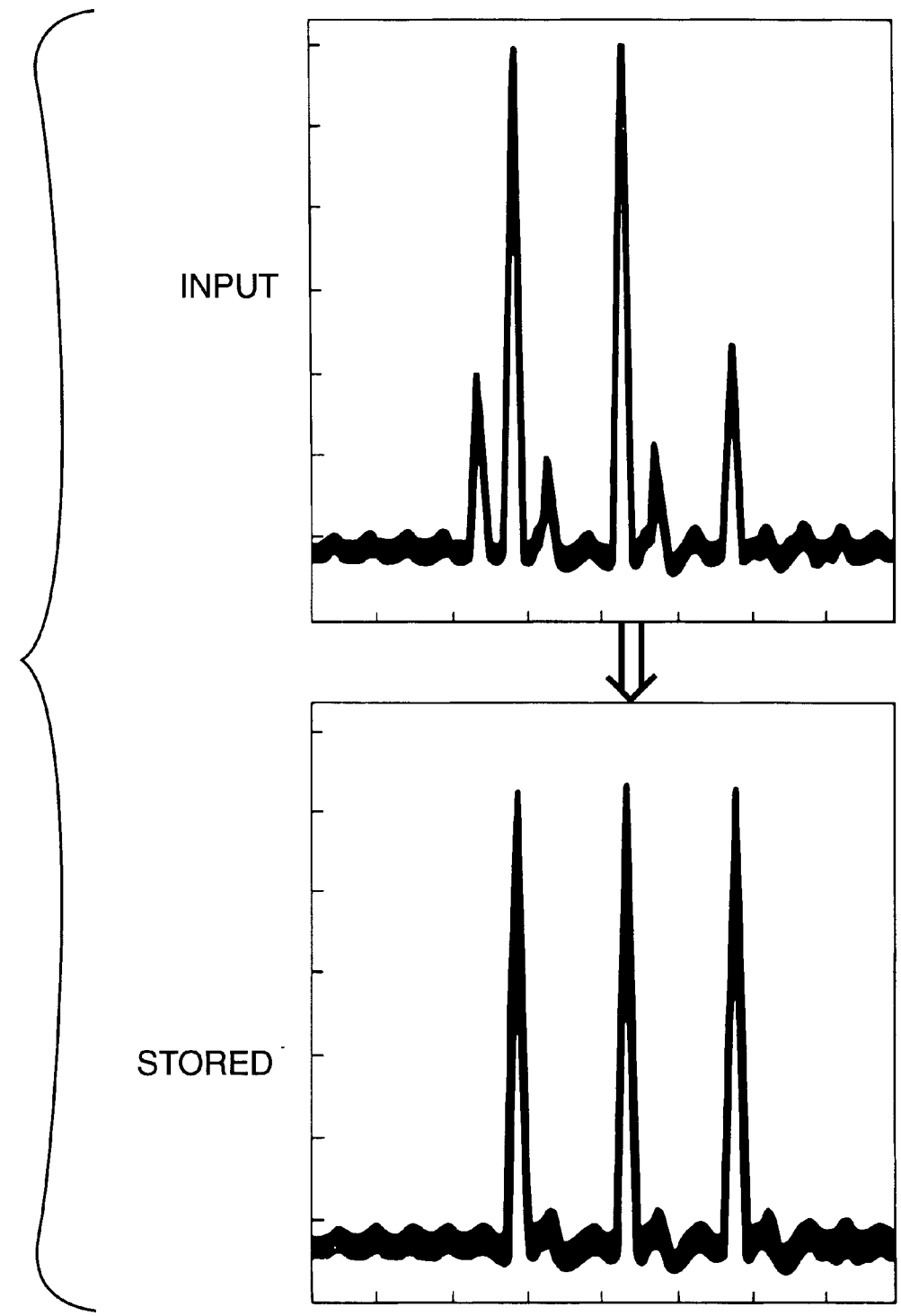
Figure 5D:
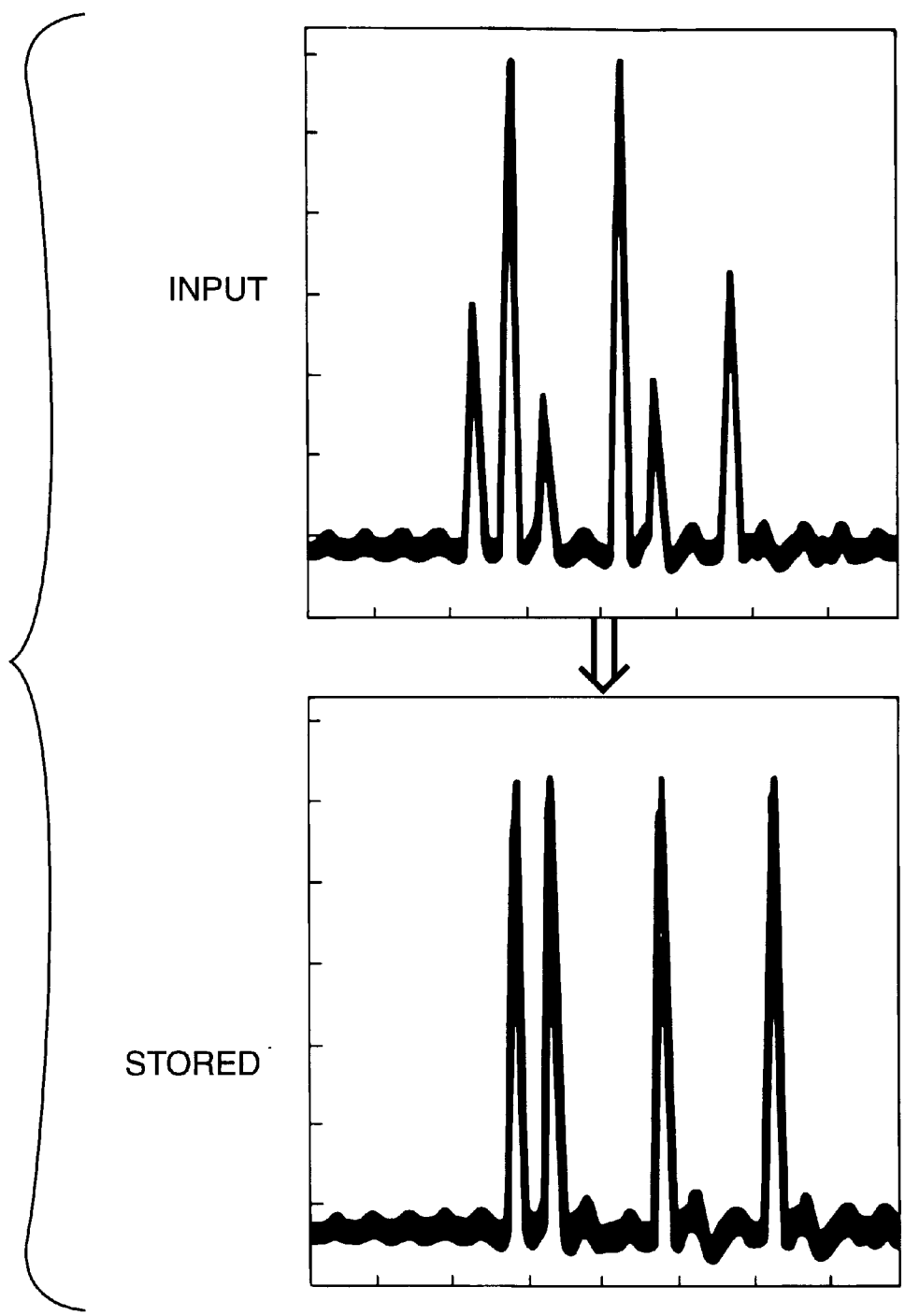
Figure 5E:
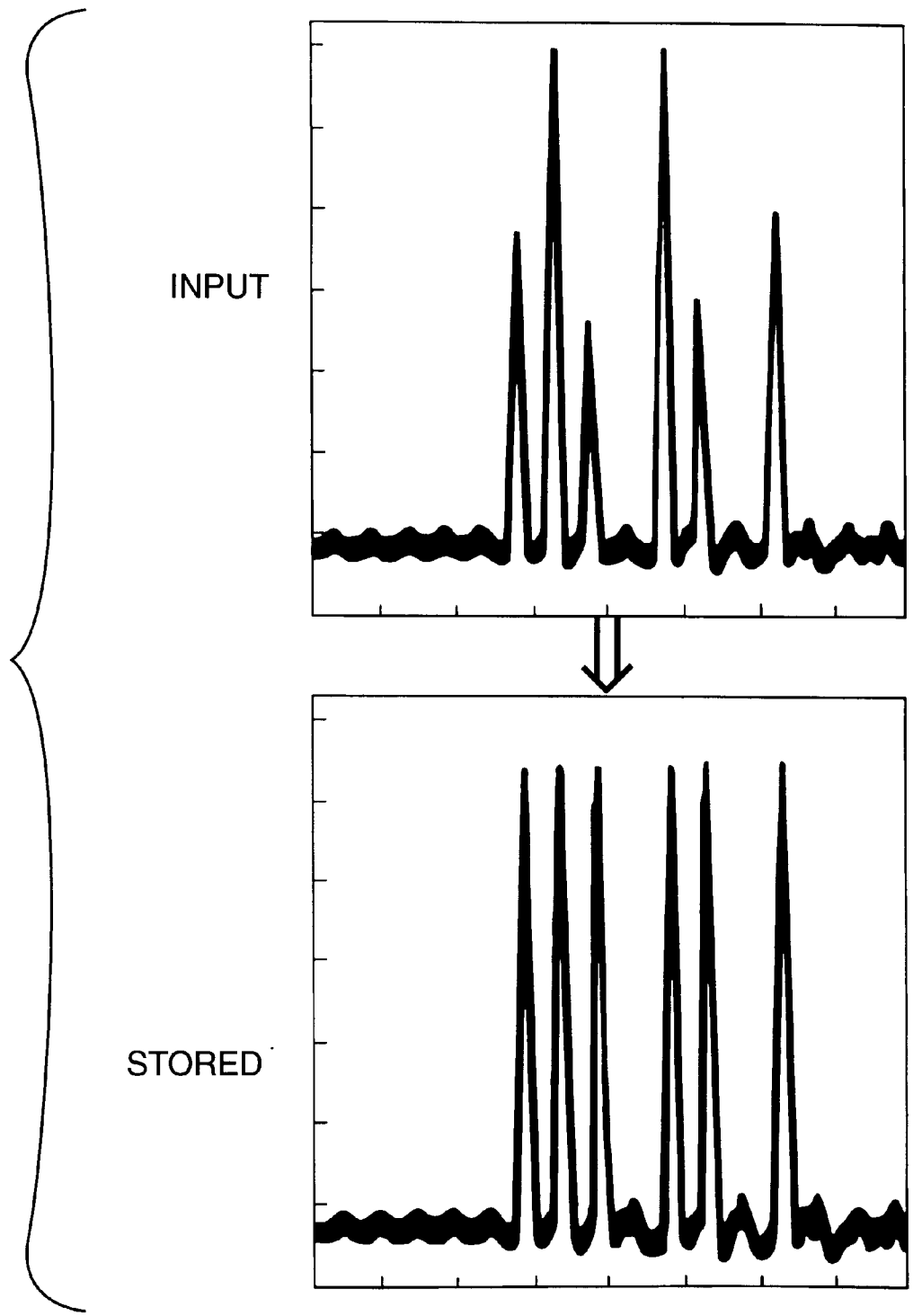

The additional signal processing functions provided by this architecture are achieved by the use of a variable threshold level, which is selected to provide stable storage. The main feature of the memory architecture which allows these additional signal processing functions is the sinusoidal transmission function of each of the nonlinear switching elements. For one round trip of the memory, there is an effective concatenation of nonlinear response functions and each time the data is regenerated, this transfer function is re-applied. Under this condition, the nonlinear switching characteristic rapidly evolves from a cosine squared response to a square window, as shown in FIG. 3. The graphs in FIG. 3 are normalised so that an energy of 1 unit gives a phase shift of pi radians (and therefore 100% switching in a TOAD) and pi radians is shown normalised to unity. The very square response is shown after 105 round trips and gives the steady state transmission of the memory. FIG. 4 shows the ranges of this eventual square window as the overall transfer of the optical switching element 4 is varied (keeping the transfer function of the optical switching element 3 fixed). Below an absolute transfer value of 0.7785, the memory does not sustain a window and the pulses are lost. As the value increases, the window gets wider and the threshold for storage is reduced. The flat top of the concatenated response creates the amplitude restoration function, as any input pulses with an initial energy in the range >pi/2 to <3 pi/2 are transformed to have equal energies. Similarly, any initial pulses with energies <pi/2 or >3 pi/2 are quickly suppressed and the threshold energy for storage is at pi/2.

In this experimental system, the data generator (not shown) used to input the pulse data pattern once into the memory has two independent channels which are combined to drive the LiNbo$_3$ amplitude modulator 5. One channel (binary sequence 01001000) is held at a constant output amplitude and the second channel (binary sequence 10100101) is changed in amplitude to create a variable amplitude input pulse sequence to the memory. Since the lifetime of the erbium amplifier 12 provided in this memory is much longer than the pulse repetition rate then all the pulses are equally amplified and retain their relative amplitudes. The experimental results are shown in FIGS. 5(a) to 5(e). The upper oscilloscope traces in each Figure show the original input pulse data patterns and the lower traces show the data patterns stored in the memory after the initial pattern has been input once. The Figures show sequentially how only the pulse amplitudes above the threshold level are stored and amplitude equalised. The dependence of the threshold level position was measured by fixing the input data pattern as in FIG. 5(c) and the threshold level varied by adjusting the gain of one of the erbium amplifier 12 between the optical switching elements 3 and 4 to modify the overall transfer function. As the threshold level is progressively lowered, the stored pattern follows the sequence shown in FIG. 5(c) to FIG. 5(e) so that all pulses are stored as opposed to only three being above the original threshold level.

It is possible to adjust the transfer function of the regenerative memory by adjusting the gain of the erbium amplifier to give a phase shift of greater than pi radians for some pulses so that instead of a square window characteristic, the concatenated transfer function is a castellated window. This allows amplitude equalization at a number of different levels, dependent on the phase shift of each pulse.

Although a single erbium amplifier 12 is shown in FIG. 2, further amplifiers may be provided as appropriate.

Figure 6:
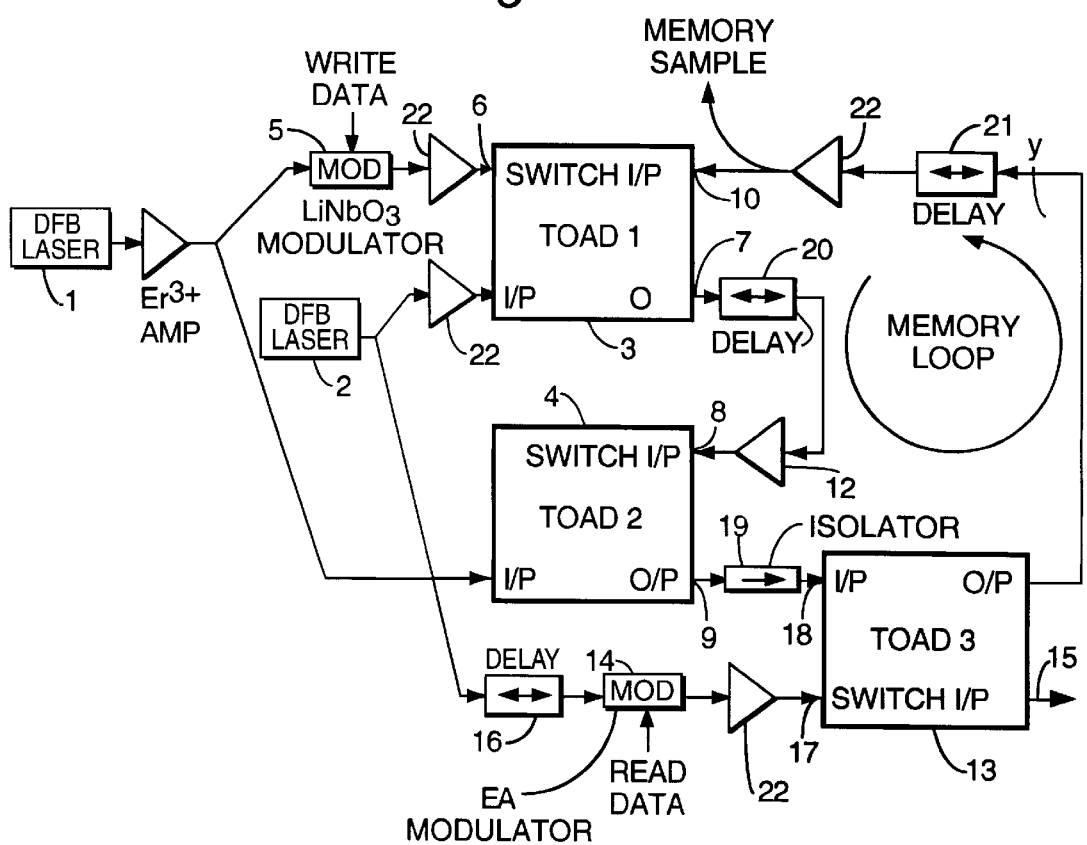
FIG. 6 shows a second example of an all-optical regenerative memory in accordance with the present invention.

The regenerative optical memory shown in FIG. 6 is similar to that of FIG. 2 but includes a third optical switching element 13 (TOAD3) which facilitates selective modification of a data pattern stored in the memory. A pulse train at $\lambda_2$ from the DFB semiconductor laser 2 is fed via a delay stage 16 to an electro absorption modulator 14 where it is modulated with read data and supplied to a switching input 17 of the third optical switching element 13. A data input 18 of the element 13 is connected via an isolator 19 to the output 9 of the switching element 4. In the absence of a switching pulse at the input 17, the pattern of data continues to circulate within the optical memory via the switching element 13. When a switching pulse is applied to the switching input of the optical switching element 13, if a data pulse is present at the input to the optical switching element 13 at the same instant, the data pulse is switched out of the memory loop 11. The switched data pulse can be read out at the output 15 of the optical switching element 13. In this manner, the optical switching element 13 performs an AND function, selectively removing data from the data pattern stored in the memory. With regard to the data pattern circulating within the optical memory, this results in selective removal of pulses corresponding to logical "1"s.

In this experimental configuration, the pulses which are read are blocked by the isolator 19 or the input to the element 13, but they could be directly accessed by using a fibre-optic circulator. The switching elements 3,4 both contain semiconductor optical amplifiers (SOAs) which have band-edges around 1560 nm. This has the advantage of maximising the phase change to gain change ratio at the operating wavelengths and reducing the degree of amplitude modulation for the pulses in the elements.

The adjustable delay line 16 and further adjustable delay lines 20,21 (e.g. Sontec ODC-300) are used to attain bit-level synchronisation.

Figure 7:
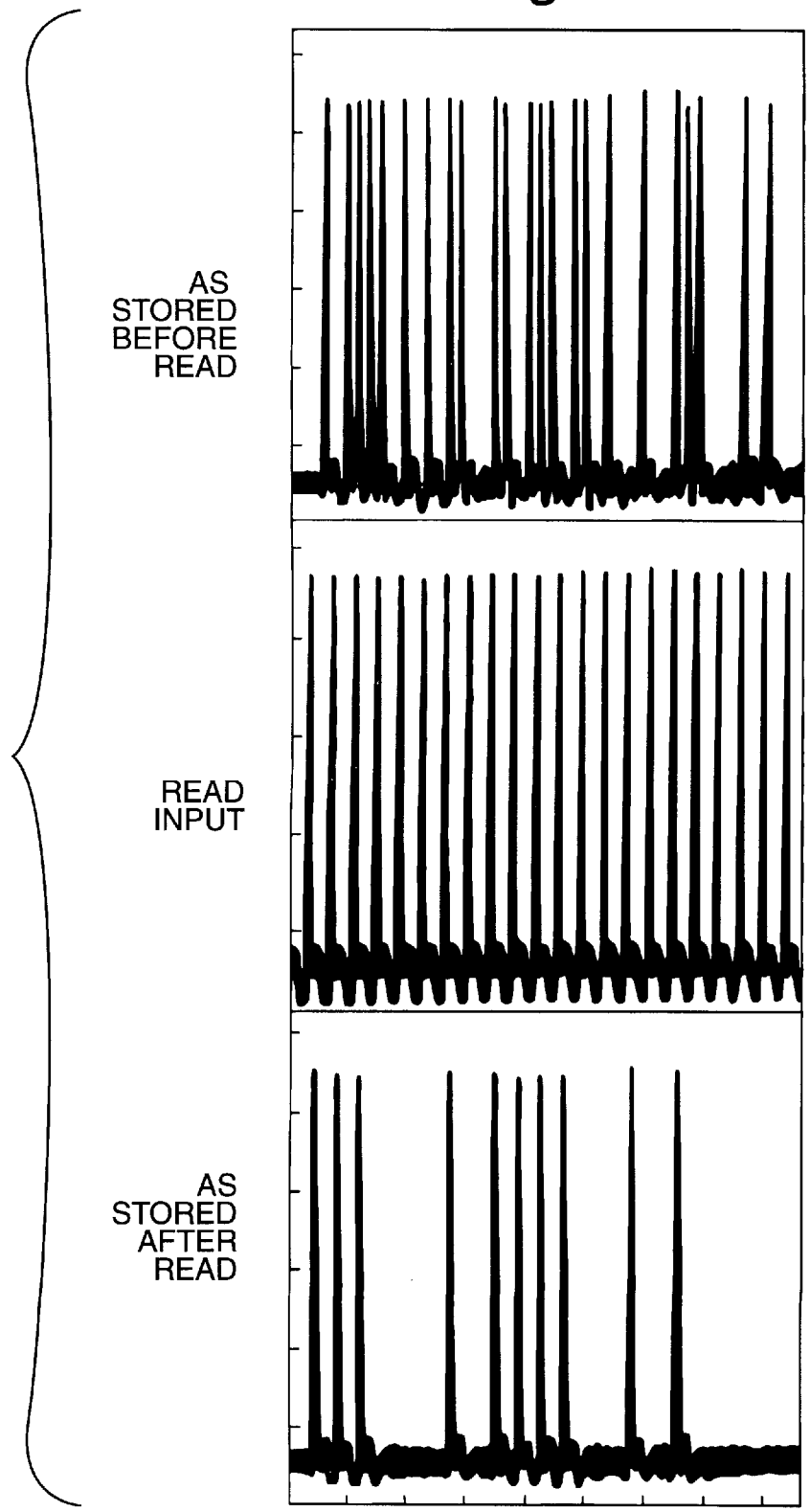
FIGS. 7 to 9 show experimental results from writing and reading data from the memory of FIG. 6 with different "read" patterns.
Figure 8:
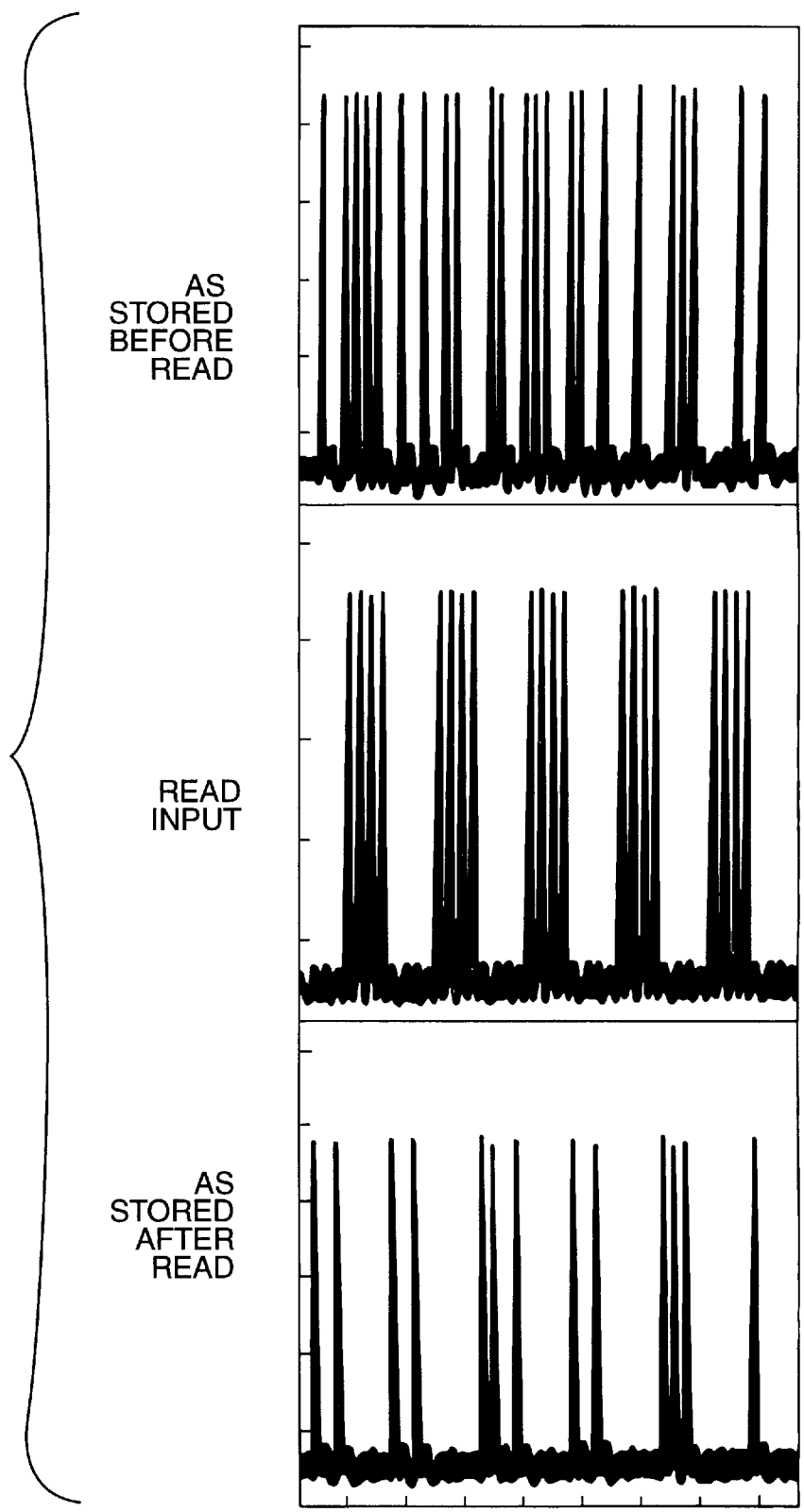
Figure 9:
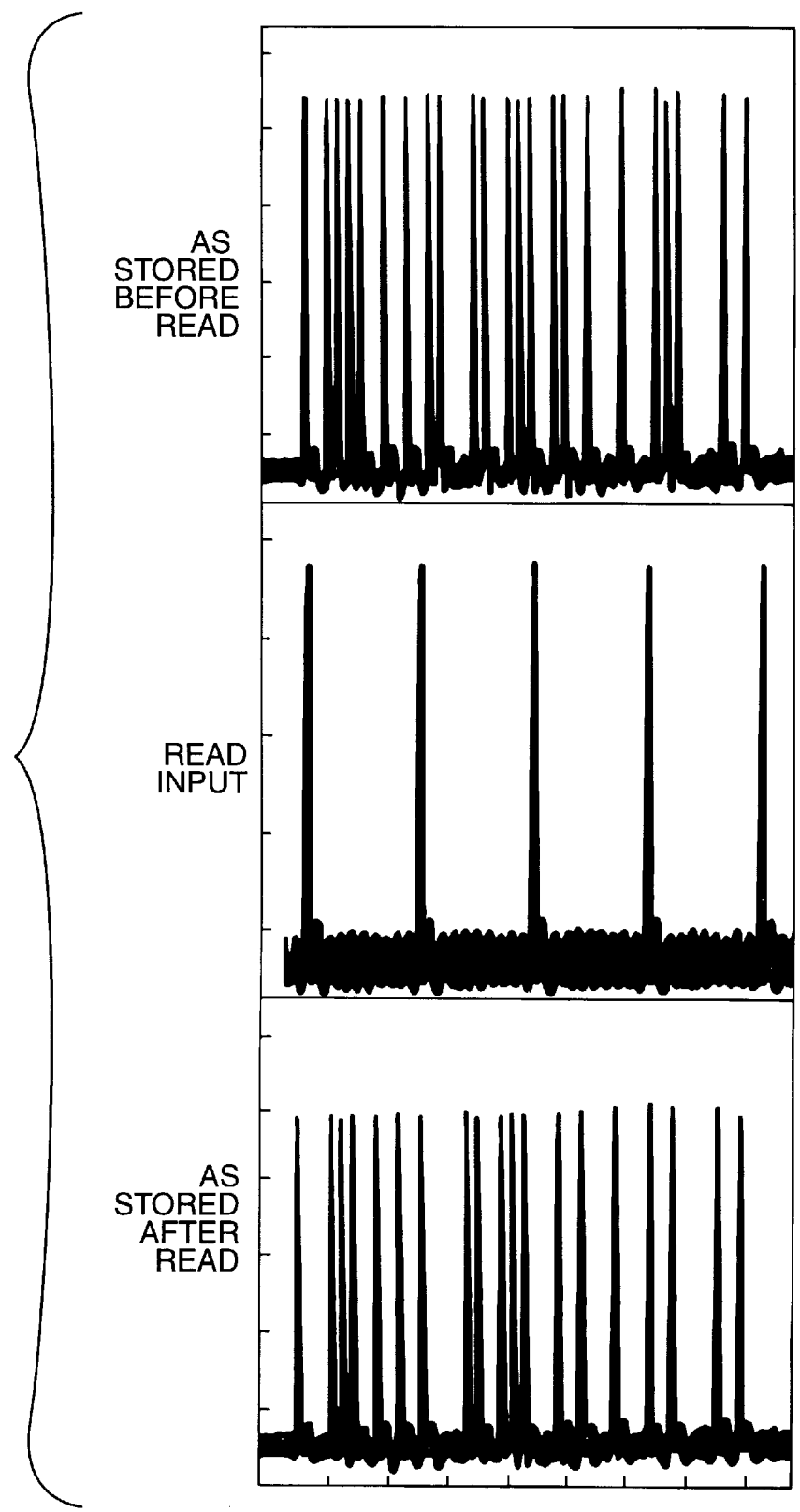

FIGS. 7, 8 and 9 show experimental results from writing and reading data from the memory with different "read" patterns. Each upper oscilloscope trace shows the 40 bit data sequence stored originally in the memory by inputting the "write" data only once. The middle oscilloscope traces show a section of the different data sequences used for the "read" operation, which were again input only once. Since there was only synchronisation of the stored data with the "read" data sequence at the bit level but no absolute synchronisation at the "memory frame" level, the length of the "read" data sequence was arranged to occupy the whole of the memory frame (~1000 bits). This guaranteed that the 40 bits of stored data were read with the first occurrence of the "read" data. The lower oscilloscope trace shows the final stored data after pulses have been selectively read. Each Figure is arranged vertically in bit-level synchronisation, so that the occurrence of a "read" pulse leads to the removal of the corresponding originally stored pulse. From careful inspection, it can be seen that the three different final stored data patterns all correctly follow from the "read" data being applied.

The read patterns used in FIGS. 7 to 9 were:

| | |
|---|---|
| 10101010101 . . . | - FIG. 7 |
| 1111000011110000 . . . | - FIG. 8 |
| 100000000010000000001 . . . | - FIG. 9 |

As in the previous example, the erbium amplifier 12 has an adjustable gain so that the threshold level can be varied to achieve amplitude equalisation. In FIG. 6, however, a number of additional erbium amplifiers 22 are also provided to ensure that the switching pulses have the correct energy.

Figure 10:
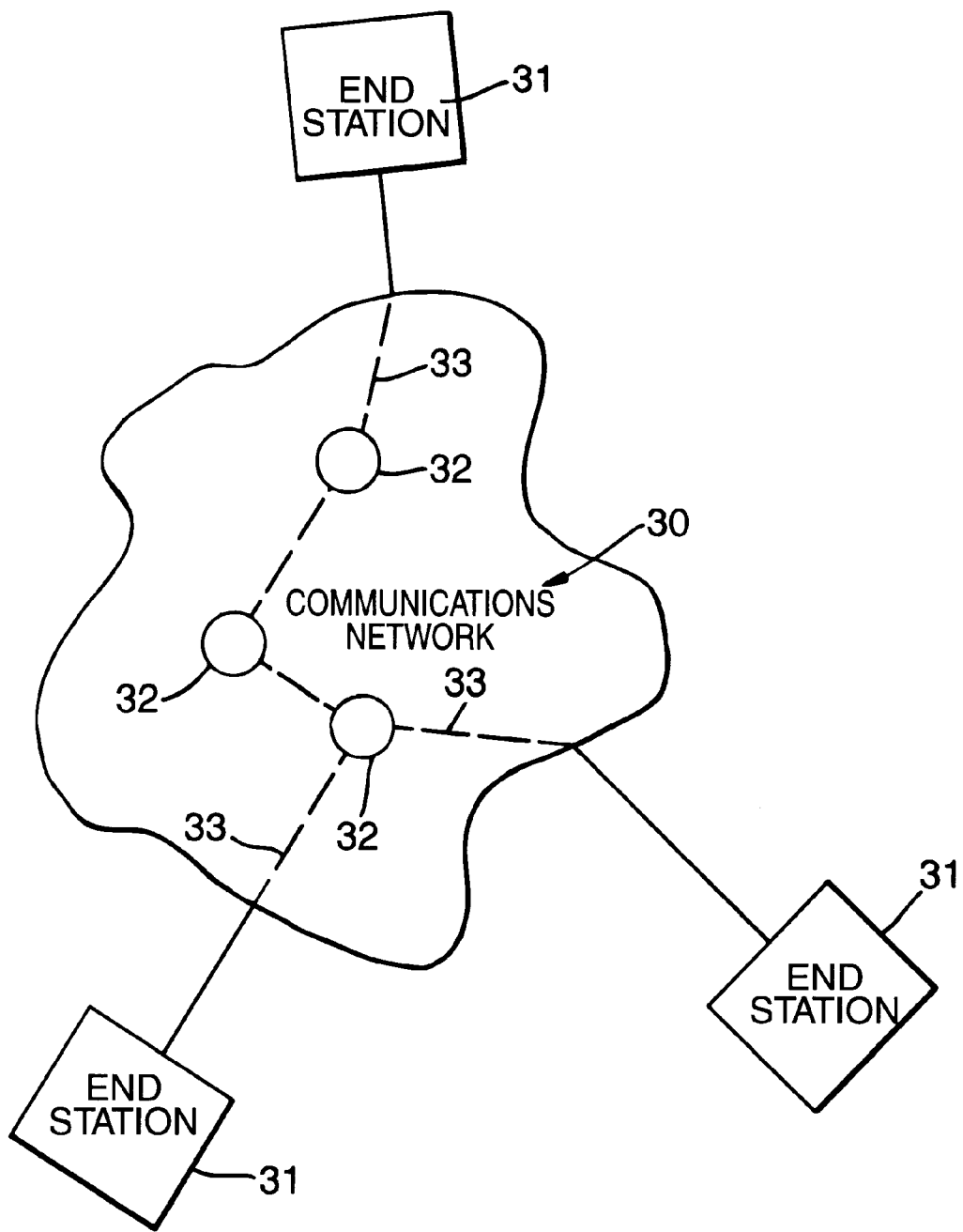
FIG. 10 shows an example of a communication network.

FIG. 10 shows a communications network 30 having a number of end stations 31 connected across the network 30 via a number of network elements 32 and optical fibre communication links 33. The network endstations 31 each include a computer incorporating a regenerative optical memory in accordance with the present invention for storing data. Likewise, the network elements 32, which, for example, may be optical switches or optical repeaters, also include a regenerative optical memory in accordance with the present invention to enable optical data to be transmitted across the network 30.

We claim:

1. A regenerative optical memory having a transfer function arranged so that only optical data having a pulse amplitude above a predetermined threshold is stored and the amplitude of optical data stored is substantially equalised to at least one predetermined level after a number of circulations within the optical memory.

2. An optical memory according to claim 1, comprising means to vary the storage threshold level.

3. An optical memory according to claim 1, comprising means for changing the spectral energy of optical data pulses.

4. An optical memory according to claim 1, comprising an optical amplifier, the gain of which is selected for stable storage of data.

5. An optical memory according to claim 1, comprising two concatenated non-linear switching elements coupled together by an optical storage element.

6. An optical memory according to claim 5, in which the optical storage element is a length of optical fibre.

7. An optical memory according to claim 5, in which the optical switching elements are interferometric non-linear switches with optical amplifiers as the non-linear element.

8. An optical memory according to claim 7, wherein each optical switching element is a terahertz optical asymmetric demultiplexer.

9. An optical memory in which a data pattern circulates within a regenerative optical loop, comprising an optical switching element within the optical loop for selectively switching at least a portion of the data pattern out of the regenerative optical loop in response to the application of an optical signal to an input of the optical switching element to alter the contents of the memory.

10. An optical memory according to claim 9, comprising an optical source for supplying switching pulses to an input of the optical switching element.

11. An optical memory according to claim 9, in which the optical switching element is an interferometric non-linear switch with an optical amplifier as the non-linear element.

12. An optical memory according to claim 9, in which the optical switching element is a terahertz optical asymmetric demultiplexer, which is responsive to switching pulses from the optical source to allow data to be switched out of the optical loop.

13. An optical memory according to claim 9, in which the optical switching element includes an output for reading out data switched out of the optical loop.

14. An optical memory according to claim 9, in which the optical memory is a regenerative memory.

15. An optical memory according to claim 14, the memory having a transfer function arranged so that only optical data having a pulse amplitude above a predetermined threshold is stored and the amplitude of optical data stored is substantially equalised to at least one predetermined level after a number of circulations within the optical memory.

16. A method of operating an optical memory in which a data pattern circulates within an optical loop of the optical memory, comprising the step of switching at least a portion of the data pattern out of the optical loop using a predetermined optical signal applied to an optical switching element positioned within the optical loop.

17. A computer comprising a regenerative optical memory having a transfer function arranged so that only optical data having a pulse amplitude above a predetermined threshold is stored and the amplitude of optical data stored is substantially equalised to at least one predetermined level after a number of circulations within the optical memory.

18. A computer comprising an optical memory having an optical switching element within the optical loop for selectively switching at least a portion of the data pattern out of the optical loop in response to the application of an optical signal to an input of the optical switching element to alter the contents of the memory.

19. An optical repeater comprising a regenerative optical memory having a transfer function arranged so that only optical data having a pulse amplitude above a predetermined threshold is stored and the amplitude of optical data stored is substantially equalised to at least one predetermined level after a number of circulations within the optical memory.

20. An optical repeater comprising an optical memory having an optical switching element within the optical loop for selectively switching at least a portion of the data pattern out of the optical loop in response to the application of an optical signal to an input of the optical switching element to alter the contents of the memory.

21. A communication network comprising a regenerative optical memory having a transfer function arranged so that only optical data having a pulse amplitude above a predetermined threshold is stored and the amplitude of optical data stored is substantially equalised to at least one predetermined level after a number of circulations within the optical memory.

22. A communication network comprising an optical memory having an optical switching element within the optical loop for selectively switching at least a portion of the data pattern out of the optical loop in response to the application of an optical signal to an input of the optical switching element to alter the contents of the memory.

23. A regenerative optical memory comprising:
  first and second non-linear optical switches connected serially with an optical delay transmission line and with an optical amplifier configured to continuously regenerate and recirculate only input optical data pulses having an amplitude above a predetermined threshold and to equalize the amplitude of such input optical data pulses to at least one predetermined level after a plurality of circulations within the optical memory.

24. A regenerative optical memory as in claim 23 wherein:
  said optical amplifier is connected serially between an output port of said first non-linear optical switch and an input port of said second non-linear optical switch; and
  said optical delay transmission line is connected serially between an output port of said second non-linear optical switch and an input port of said first non-linear optical switch.

25. A regenerative optical memory as in claim 23 further comprising:
  a third non-linear optical switch connected serially with said first and second optical switches.

26. A regenerative optical memory as in claim 25 wherein:
  said optical amplifier is connected serially between an output port of said first non-linear optical switch and an input port of said second non-linear optical switch;
  said third non-linear optical switch has an input port connected to an output port of said second non-linear optical switch; and
  said optical delay transmission line is connected serially between an output port of said third non-linear optical switch and an input port of said first non-linear optical switch.

27. A regenerative optical memory as in claim 26 further comprising an optical delay stage connected serially with said amplifier between the first and second non-linear optical switches.

28. A regenerative optical memory as in claim 27 further comprising a second amplifier connected serially with said optical delay transmission line between said third and first non-linear optical switches.

* * * * *